United States Patent [19]

Dydyk

[11] Patent Number: 4,494,086
[45] Date of Patent: Jan. 15, 1985

[54] TRANSMISSION LINE OSCILLATOR HAVING INDEPENDENTLY ADJUSTABLE Q AND INPUT RESISTANCE

[75] Inventor: Michael Dydyk, Scottsdale, Ariz.
[73] Assignee: Motorola, Inc., Schaumburg, Ill.
[21] Appl. No.: 403,760
[22] Filed: Jul. 30, 1982
[51] Int. Cl.³ .................. H03B 5/18; H03B 7/12; H03B 9/14; H01P 7/08
[52] U.S. Cl. .................. 331/96; 331/107 DP; 331/107 SL; 331/117 D; 333/204
[58] Field of Search ............ 331/96, 107 DP, 107 SL, 331/107 G, 117 D

[56] References Cited

U.S. PATENT DOCUMENTS

| | | | |
|---|---|---|---|
| 3,721,918 | 3/1973 | Rosen et al. | 331/96 |
| 4,005,372 | 1/1977 | Ho et al. | 331/107 SL X |
| 4,311,970 | 1/1982 | Bert et al. | 331/96 X |

FOREIGN PATENT DOCUMENTS

| | | | |
|---|---|---|---|
| 2458175 | 1/1981 | France | 331/107 SL |
| 55153 | 5/1979 | Japan | 331/96 |
| 53908 | 4/1980 | Japan | 331/117 D |
| 2026800 | 2/1980 | United Kingdom | 331/107 SL |

OTHER PUBLICATIONS

Reynolds, J. F. et al., "Coupled TEM Bar Circuit for L-Band Silicon Avalanche Oscillators" IEEE Journal of Solid State Circuits, v. SC, N. 6, pp. 346-353 (Dec. 1970).

Primary Examiner—Eugene R. LaRoche
Assistant Examiner—W. R. Paxman
Attorney, Agent, or Firm—Eugene A. Parsons

[57] ABSTRACT

A transmission line microwave oscillator having two degrees of freedom wherein the real portion, $R_{in}$, of the input impedence seen by the active device is adjustable by changing the coupling coefficient between and active device and a resonator and where the external quality, $Q_{EXT}$, of the oscillator is adjustable by changing the coupling between the resonator and an output transmission line.

17 Claims, 7 Drawing Figures

TRANSMISSION LINE OSCILLATOR HAVING INDEPENDENTLY ADJUSTABLE Q AND INPUT RESISTANCE

BACKGROUND OF THE INVENTION

The present invention pertains in general to transmission line oscillators and more particularly to transmission line oscillators having two degrees of freedom.

The need for an oscillator with a specific $Q_{ext}$ arises from the requirements of specific applications. For example, when an oscillator is to be used in an injection locking mode, the $Q_{ext}$ must be low. The actual value of $Q_{ext}$ depends upon the locking bandwidth and the desired gain. On the other hand, when having a low residual noise of the oscillator is paramount, the $Q_{ext}$ must be high.

In existing circuits where both the input impedance seen by the active device and the $Q_{ext}$ are a function of the coupling coefficient, it is not possible to construct such an oscillator to have a specific $Q_{ext}$ because such an oscillator has only one degree of freedom, which is used to establish the oscillation condition.

Therefore, it is desirable to have a circuit which satisfies both the conditions of sustained oscillation and the requirement for a specific $Q_{ext}$ independently.

SUMMARY OF THE INVENTION

Accordingly it is an object of the present invention to provide a new and improved transmission line oscillator having two degrees of freedom.

It is a further object of the present invention to provide a new and improved transmission line oscillator having two degrees of freedom wherein a half-wave resonator provides input and output coupling mechanisms.

Among the advantages of the present invention are the ability to use photolithographic techniques which provide cost effectiveness, smaller size and lower weight.

A further advantage of the present invention is that it allows simple integration with the rest of a transmission line system.

Yet another advantage of the present invention is that it can be used anywhere a planar circuit approach is called for and yet can provide the sort of performance otherwise only attainable using waveguide technology.

These and other objects and advantages of the present invention will become apparent to those skilled in the art upon consideration of the accompanying specification, claims and drawings.

In order to attain the above mentioned and other objects and advantages the present invention involves a microwave transmission line oscillator having two degrees of freedom, comprising a diode coupled to a means for providing resonance which in turn is coupled to an output transmission line such that the real part of the input impedance seen by the diode is adjustable by changing the coupling between the diode and the means for providing resonance and such that $Q_{ext}$ is adjustable by changing the coupling between the output transmission line and the means for providing resonance.

DESCRIPTION OF THE PREFERRED EMBODIMENTS

While the various embodiments of the present invention are described in microstrip transmission lines, it will be understood by those skilled in the art that strip line and other planar transmission lines will operate in basically the same fashion. Further, an IMPATT diode is described as the active device but it will be understood that other active devices might be utilized as is well known in the art.

Conventional IMPATT diode oscillator circuits in microstrip transmission media consist of a bias filter to RF isolate the bias port from the diode, and a coupled line transformer which performs the proper load transformation to satisfy oscillation conditions. For this circuit, both the input impedance seen by the diode and the $Q_{ext}$ are a function of the coupled line coupling coefficient such that $$Q_{ext} = \frac{\omega}{2 R_{in}} \left. \frac{d X_{in}}{d\omega} \right|_{\omega = \omega_o} = \frac{\pi}{4} \frac{k^2}{1 - k^2} \quad (1)$$

where
$Q_{ext}$ = the external quality of the oscillator,
$\omega$ = a frequency under evaluation,
$R_{in}$ = the real part of the input impedance,
$X_{in}$ = the imaginary part of the input impedance,
$\omega_o$ = the resonant frequency of the system, and
k = the coupling coefficient of the coupled line transformer.

In such circuits, k must be set to satisfy the conditions of oscillation. However, once set to satisfy the conditions of oscillation, k cannot be changed further to obtain a desired $Q_{ext}$, and, hence, to obtain a desired bandwidth for the system, called the locking bandwidth. Therefore, the system can be said to have only one degree of freedom so that $$R_{in} = k^2 Z_o. \quad (2)$$

Figure 1A:
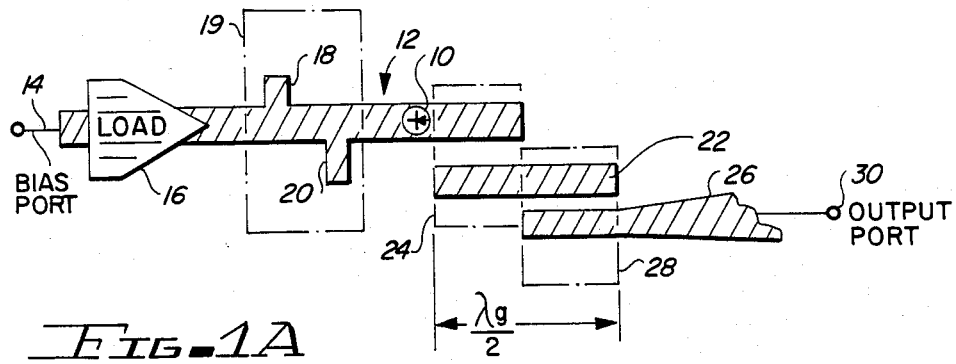
FIG. 1A is a schematic diagram of a first device embodying the present invention.

A microstrip transmission line oscillator having two degrees of freedom according to the present invention is shown in FIG. 1A. A diode 10 is coupled to an input transmission line 12 which is in turn coupled to a bias port 14. Between diode 10 and port 14, a stabilizing load 16 is coupled to line 12. Between load 16 and diode 10 a first open-circuited stub 18 and a second open-circuited stub 20 are coupled to line 12 to form a band reject filter 19.

Input transmission line 12 is coupled to a half-wave resonator 22 via a first coupled line mechanism 24. Likewise, half-wave resonator 22 is coupled to an output transmission line 26 via a second coupled line mechanism 28. Line 26 is further coupled to an output port 30.

Diode 10 may be an IMPATT diode. Resonator 22 may be a portion of an inner conductor of a microstrip transmission line having a length equal to a multiple of half of the guide wavelength, $\lambda_g$, of the desired oscillating frequency. Stabilizing load 16 may comprise a distributed termination. Transmission lines and coupled line mechanisms are well known and readily available to those skilled in the art and will not be discussed further.

The principal difficulty of obtaining a sustained oscillation from an IMPATT diode is moding, which is caused by the large frequency bandwidth over which negative resistance may be obtained. Assuming that the magnitude of the real impedance of diode 10 is small compared to a microstrip characteristic impedance, stabilizing load 16 may be introduced between diode 10 and bias port 14. Due to the action of stabilizing load 16, the resulting circuit provides oscillations only at the frequency established by resonator 22.

However, when due consideration is given to the environment of the IMPATT diode, including package parasitics, no net negative resistance is obtained. To overcome this problem, the band reject filter 19 is introduced between diode 10 and stabilizing load 16. This approach virtually eliminates the effect of the stabilizing load in the operating frequency while retaining its presence elsewhere.

Figure 1B:
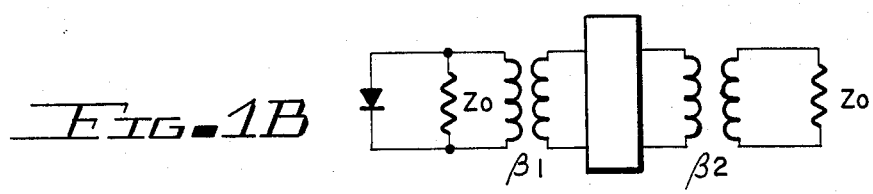
FIG. 1B is a diagrammatic representation of the embodiment of FIG. 1.

It can be shown for the embodiment of FIG. 1A, as diagrammatically illustrated in FIG. 1B, the real input impedance, $R_{in}$, seen by the active device is given by $$R_{in} = \frac{Z_o \beta_1}{1 + \beta_2} \quad (3)$$

where:
$\beta_1$ = the input coupling coefficient to the half-wave resonator,
$\beta_2$ = the output coupling coefficient to the half-wave resonator, and
$Z_o$ = the characteristic impedance associated with output port 30.

A desired $R_{in}$ is obtained by adjusting $\beta_1$ or $\beta_2$. In this case, $\beta_2$ is related to $Q_{ext}$ as $$\beta_2 = \frac{Q_o}{Q_{ext}} \quad (4)$$

where: $Q_o$ is the quality factor of the half-wave resonator and where all other variables are as defined above.

If $\beta_2$ is fixed in order to achieve a specific value of $Q_{ext}$, a desired value for the real input impedance seen by the active device, $R_{in}$, is realized by adjusting $\beta_1$. The coupling coefficient associated with a coupled line mechanism is changed by varying the spacing of the transmission lines from a maximum coefficient of 1, when the lines are attached, through progressively smaller values as the space between the lines is increased.

Figure 2:
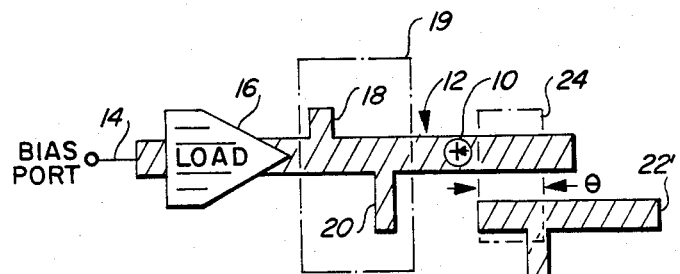
FIG. 2 is a schematic diagram of a second device embodying the present invention.

A second embodiment of the present invention, as shown in FIG. 2, allows larger values for coupling coefficient $\beta_2$ than does the embodiment of FIG. 1. In FIG. 2, structures which are the same as those in the embodiment of FIG. 1 are referenced by the same numerals while structures which replace or which are altered from the devices as shown in FIG. 1 are indicated by the addition of a prime.

Specifically, a half-wave resonator 22' is directly attached to a transmission line 26'. The point of direct attachment is chosen in terms of a phase angle $\theta$ to achieve the desired coupling coefficient. In order to minimize the effect of the tee junction between resonator 22' and line 26' it is appropriate to increase the characteristic impedance of input line 12. In order to reduce the discontinuity effect of the coupling between resonator 22' and line 26' it is appropriate to taper line 26' as shown in FIG. 2. Two degrees of freedom are attained by the ability to adjust coupling coefficient $\beta_1$ by changing the spacing between line 12 and resonator 22', and by the ability to adjust the tap point of line 26', due to the fact that $\beta_2$ is proportional to $\cos^2 \theta$.

Figure 3:
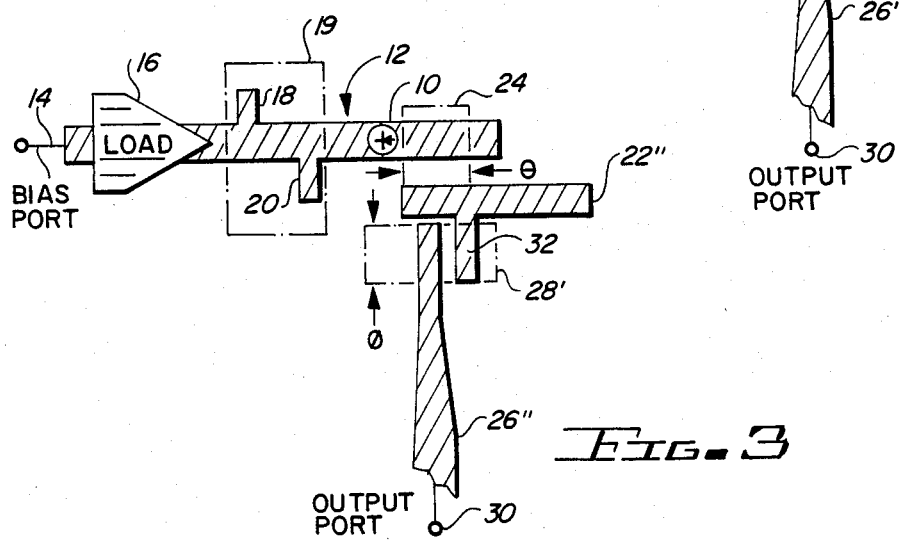
FIG. 3 is a schematic diagram of a third device embodying the present invention.

A third embodiment of the present invention, as shown in FIG. 3, allows for medium to high and low values of $Q_{ext}$. In FIG. 3, structures which are the same as those in the embodiment of FIG. 2 are referenced by the same numerals while structures which replace or altered from the device shown in FIG. 1 are indicated by the addition of a double prime.

Specifically, resonator 22" is altered from resonator 22' by the addition of an open circuited stub 32 which is coupled to an output transmission line 26" to form a coupled line transformer 28'. As is shown below, $\beta_2$ is proportional to $\cos^2 \theta$ where $\theta$ is the phase angle associated with the tap point of the junction of stub 32 and resonator 22".

In microstrip transmission media it is desirable to be able to change coupling coefficient $\beta_2$ without having to change the circuit. As is discussed further below, $\beta_2$ is inversely proportional to a function of a phase angle $\phi$ associated with the length of transmission line 26" coupled to stub 32. By changing the length of transmission line 26" associated with angle $\phi$, which can be done using laser cutting techniques, $\beta_2$ is changed without redesigning the circuit. The choice of the tap point of stub 32 on resonator 22" determines a length associated with phase angle $\theta$ which is directly related to coupling coefficient $\beta_2$ and which provides an additional means of adjustment for $\beta_2$.

Figure 4:
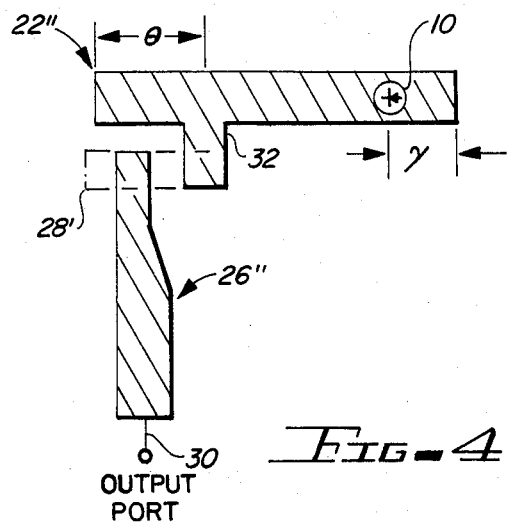
FIG. 4 is a schematic diagram of a fourth device embodying the present invention.

The fourth embodiment of the present invention, as shown in FIG. 4, provides another oscillator having two degrees of freedom. In FIG. 4, structures which are the same as those in the embodiment of FIG. 3 are referenced by the same numerals while structures which replace or are altered from the device as shown in FIG. 3 are indicated by the addition of a prime.

Specifically, diode 10 is embedded in resonator 22" and the coupling between diode 10 and resonator 22" depends on the distance of diode 10 from the end of resonator 22" that is closest to diode 10, hereinafter referred to as the proximal end. The distance of diode 10 from the proximal end of resonator 22" is associated with a phase angle $\gamma$ just as the coupling of resonator 22" to transmission line 26" depends upon the tap point of stub 32 which is associated with the phase angle $\theta$. In the embodiment of FIG. 4, changing $\gamma$ changes $\beta_1$ and changing $\theta$ changes $\beta_2$. A bias circuit for this embodiment is not shown for the sake of clarity but such a circuit may be realized by a bias filter, stabilizing load and bias port all coupled to resonator 22".

Figure 5:
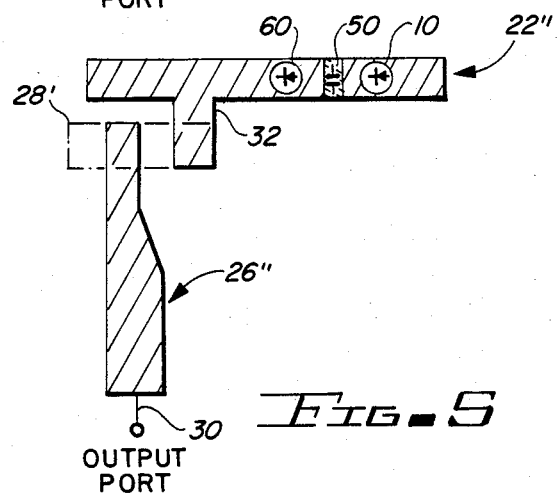
FIG. 5 is a schematic diagram of a fifth device embodying the present invention.

A fifth embodiment of the present invention as shown in FIG. 5, allows for changing the frequency of the oscillator electronically. In FIG. 5, the device as shown in FIG. 4 is augmented by coupling a varactor 60 to resonator 22" between diode 10 and stub 32 and by coupling a capacitor 50 between diode 10 and varactor 60. Varactor 60 is used to tune the oscillator by varying a voltage applied to varactor 60. For the sake of clarity a bias circuit is not shown for this embodiment but such a circuit may be realized by using a bias filter, stabilizing load and bias port all coupled to resonator 22". Capacitor 50 may be a beam lead capacitor which serves to DC isolate diode 10 from varactor 60.

ANALYTICAL BASIS OF THE OSCILLATOR CIRCUIT

In general, microstrip oscillator circuits have very little adjustment capability. Therefore, it is important to thoroughly understand the circuit by means of an analytical model.

Figure 6:
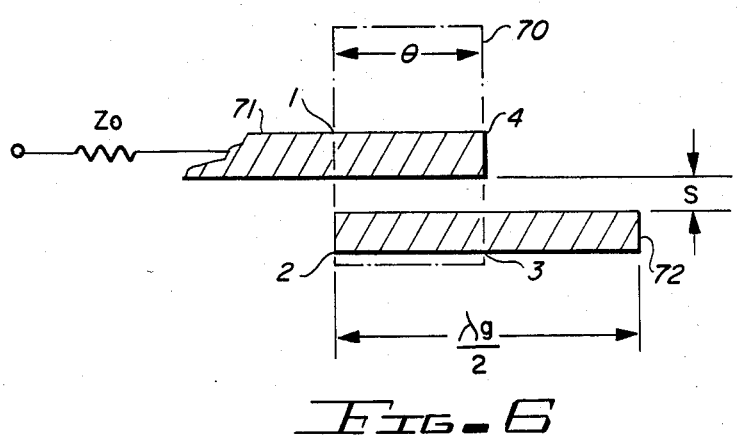
FIG. 6 is a diagrammatic model of the coupling mechanism between a half-wave resonator and a transmission line according to the present invention.

In FIG. 6, the input and output coupling mechanisms of the present invention are modeled by a single model of a coupled line in order to determine the dependency and limitation of these coupling mechanisms to the half-wave resonator. The circuit of FIG. 6 comprises a coupled line mechanism 70 of $\theta$ electrical degrees formed by the coupling of a line 71 and a half-wave resonator 72 and having four ports, 1, 2, 3 and 4. Resonator 72 and line 71 are separated by a distance, s. Ports 2 and 4 are open circuited, port 3 is terminated with an open circuited line of $\pi$ minus $\theta$ electrical degrees and port 1 is terminated in a characteristic impedance $Z_o$.

The impedance matrix representation of the 4 port network is given by, $$\begin{bmatrix} V_1 \\ V_2 \\ V_3 \\ V_4 \end{bmatrix} = \begin{bmatrix} z_{11} & z_{12} & z_{13} & z_{14} \\ z_{12} & z_{11} & z_{14} & z_{13} \\ z_{13} & z_{14} & z_{11} & z_{12} \\ z_{14} & z_{13} & z_{12} & z_{11} \end{bmatrix} \times \begin{bmatrix} i_i \\ 0 \\ i_3 \\ 0 \end{bmatrix} \quad (5)$$

where:
- $V_1$ = the voltage across port 1,
- $V_2$ = the voltage across port 2,
- $V_3$ = the voltage across port 3,
- $V_4$ = the voltage across port 4,
- $z_{11}$, $z_{12}$, $z_{13}$, and $z_{14}$ = the impedance elements of a four port network,
- $i_1$ = the input current at port 1, and
- $i_3$ = the input current at port 3.

With the specific loads of FIG. 6, the input impedance, $Z_{in}$, is determined to be $$Z_{in} = z_{11} - \frac{z_{13}^2}{z_{11} + Z_3} \quad (6)$$

where:

$$z_{11} = \frac{Z_{oe} + Z_{oo}}{2} \coth \gamma l_o,$$

$$z_{13} = \frac{Z_{oe} - Z_{oo}}{2} \operatorname{csch} \gamma l_o,$$

$$Z_3 = Z_o \coth \gamma l,$$

$$\gamma = \alpha + j\beta,$$

$$Z_o = \frac{Z_{oe} + Z_{oo}}{2},$$

$$\theta = \frac{2\pi}{\lambda_g} l_o,$$

$$l = \frac{\lambda_{go}}{2} - l_o,$$

- $l_o$ = the physical length of the coupled section of line,
- $Z_{oe}$ = the even mode characteristic impedance of the coupled line,
- $Z_{oo}$ = the odd mode characteristic impedance of the coupled line,
- $Z_o$ = the output characteristic impedance,
- $\alpha$ = the attenuation constant of the coupled line,
- $\beta$ = the propagation constant of the coupled line,
- $\lambda$ = the free space wavelength,
- $\lambda_g$ = the guide wavelength of the microstrip transmission line, and
- $\lambda_{go}$ = the guide wavelength at the center frequency.

By making appropriate substitutions and performing the necessary operations, the dependency of the coupling coefficient is established and is given by $$\beta_1 = \frac{k^2}{\sinh \frac{\pi}{2Q_o}} \left( \frac{\theta}{90°} \right) \quad (7)$$

where all variables are as defined above.

In order to establish a limitation on $\beta_1$, it is necessary to determine the maximum practical k and $Q_o$ achievable with the shielded microstrip transmission media. Because the maximum practical values are frequency dependent, for the purposes of calculation Q-band frequency range is discussed below. Selecting a 10 mil Cu-Flon substrate material for this portion of the EHF frequency range, some computer-generated characteristics of a shielded microstrip line according to the present invention at 38 GHz are indicated in Table 1. One of the characteristics is the unloaded quality factor, $Q_o$, which for the characteristic of 50Ω is 487.

TABLE I

| THEORETICAL PARAMETERS OF SHIELDED MICROSTRIP | | | | | | | | | |
|---|---|---|---|---|---|---|---|---|---|
| DIELECTRIC CONSTANT | | | | | | | | | 2.10000 |
| LOSS TANGENT | | | | | | | | | 0.00045 |
| SUBSTRATE THICKNESS(in.) | | | | | | | | | 0.01000 |
| TOTAL CONDUCTOR THICKNESS(in.) | | | | | | | | | 0.00033 |
| FREQUENCY(Hz) | | | | | | | | | 38.00000 |
| SURFACE FINISH(microinches) | | | | | | | | | 8.00000 |
| CUTOFF FREQUENCY(Hz) | | | | | | | | | 285.381 |
| 1 oz = 1.4 miles | | | | | | | | | |

| WIDTH in. | Z ohms | $E_{ef}$ | LOSS Cu db/in. | Die. db/in. | Fin db/in. | L-Tot db/in. | Q's Cir | Res. | Q-Tot | LAMDA in. |
|---|---|---|---|---|---|---|---|---|---|---|
| 0.005 | 129.3 | 1.69 | 0.275 | 0.039 | 0.084 | 0.397 | 285 | 60 | 50 | 0.241 |
| 0.006 | 120.7 | 1.70 | 0.256 | 0.039 | 0.078 | 0.374 | 304 | 57 | 48 | 0.240 |
| 0.008 | 113.4 | 1.71 | 0.242 | 0.040 | 0.074 | 0.356 | 320 | 53 | 46 | 0.240 |

TABLE I-continued

| | | | | | | | | | | |
|---|---|---|---|---|---|---|---|---|---|---|
| 0.009 | 101.8 | 1.73 | 0.222 | 0.040 | 0.868 | 0.331 | 346 | 48 | 42 | 0.239 |
| 0.010 | 97.0 | 1.74 | 0.214 | 0.041 | 0.066 | 0.321 | 357 | 46 | 41 | 0.238 |
| 0.011 | 92.5 | 1.74 | 0.208 | 0.041 | 0.064 | 0.314 | 366 | 44 | 40 | 0.238 |
| 0.012 | 88.8 | 1.75 | 0.202 | 0.041 | 0.062 | 0.306 | 376 | 43 | 38 | 0.237 |
| 0.013 | 85.3 | 1.76 | 0.197 | 0.042 | 0.061 | 0.299 | 385 | 41 | 37 | 0.237 |
| 0.014 | 82.2 | 1.77 | 0.192 | 0.042 | 0.059 | 0.239 | 394 | 40 | 36 | 0.236 |
| 0.015 | 79.3 | 1.77 | 0.187 | 0.042 | 0.058 | 0.287 | 403 | 38 | 35 | 0.236 |
| 0.016 | 76.5 | 1.78 | 0.182 | 0.042 | 0.056 | 0.281 | 413 | 37 | 34 | 0.236 |
| 0.017 | 74.0 | 1.79 | 0.177 | 0.043 | 0.055 | 0.275 | 422 | 36 | 33 | 0.235 |
| 0.018 | 71.7 | 1.79 | 0.172 | 0.043 | 0.053 | 0.269 | 432 | 35 | 32 | 0.235 |
| 0.019 | 69.5 | 1.80 | 0.168 | 0.043 | 0.052 | 0.263 | 443 | 34 | 32 | 0.235 |
| 0.020 | 67.4 | 1.80 | 0.165 | 0.043 | 0.051 | 0.260 | 448 | 33 | 31 | 0.234 |
| 0.021 | 65.5 | 1.81 | 0.164 | 0.043 | 0.051 | 0.258 | 452 | 32 | 30 | 0-234 |
| 0.022 | 63.7 | 1.81 | 0.162 | 0.044 | 0.050 | 0.256 | 456 | 32 | 29 | 0.234 |
| 0.023 | 61.9 | 1.82 | 0.161 | 0.044 | 0.050 | 0.254 | 459 | 31 | 29 | 0.234 |
| 0.024 | 60.3 | 1.83 | 0.159 | 0.044 | 0.049 | 0.253 | 463 | 30 | 28 | 0.233 |
| 0.025 | 58.8 | 1.83 | 0.158 | 0.044 | 0.049 | 0.251 | 466 | 29 | 28 | 0.233 |
| 0.026 | 57.3 | 1.83 | 0.157 | 0.044 | 0.049 | 0.250 | 469 | 29 | 27 | 0.233 |
| 0.027 | 56.0 | 1.84 | 0.156 | 0.044 | 0.048 | 0.248 | 472 | 28 | 26 | 0.233 |
| 0.028 | 54.7 | 1.84 | 0.154 | 0.045 | 0.048 | 0.247 | 475 | 27 | 26 | 0.232 |
| 0.029 | 53.4 | 1.85 | 0.153 | 0.045 | 0.048 | 0.246 | 478 | 27 | 25 | 0.232 |
| 0.030 | 52.2 | 1.85 | 0.152 | 0.045 | 0.047 | 0.244 | 481 | 26 | 25 | 0.232 |
| 0.031 | 51.1 | 1.86 | 0.151 | 0.045 | 0.047 | 0.243 | 484 | 26 | 24 | 0.232 |
| 0.032 | 50.0 | 1.86 | 0.150 | 0.045 | 0.047 | 0.242 | 487 | 25 | 24 | 0.232 |
| 0.033 | 49.0 | 1.87 | 0.149 | 0.045 | 0.046 | 0.241 | 489 | 25 | 24 | 0.231 |
| 0.034 | 48.0 | 1.87 | 0.148 | 0.045 | 0.046 | 0.240 | 492 | 24 | 23 | 0.231 |
| 0.035 | 47.0 | 1.87 | 0.147 | 0.046 | 0.046 | 0.230 | 495 | 24 | 23 | 0.231 |
| 0.036 | 46.1 | 1.88 | 0.147 | 0.046 | 0.046 | 0.238 | 497 | 23 | 22 | 0.231 |
| 0.037 | 45.2 | 1.88 | 0.146 | 0.046 | 0.045 | 0.237 | 499 | 23 | 22 | 0.231 |
| 0.038 | 44.4 | 1.88 | 0.145 | 0.046 | 0.045 | 0.236 | 502 | 23 | 22 | 0.230 |
| 0.039 | 43.6 | 1.89 | 0.144 | 0.046 | 0.045 | 0.235 | 504 | 22 | 21 | 0.230 |
| 0.048 | 42.8 | 1.89 | 0.144 | 0.046 | 0.045 | 0.234 | 506 | 22 | 21 | 0.230 | where:
- width = the inner conductor width of microstrip transmission line,
- Z = the values of characteristic impedance,
- $E_{ef}$ = the effective dielectric constant,
- Cu = the attenuation constant of microstrip transmission line due to copper,
- Die = the attenuation constant of microstrip transmission line due to lossy dielectric,
- Fin = the attenuation constant of microstrip transmission line due to conductor finish,
- Cir = the circuit quality factor,
- Res = the resonator quality factor,
- Q-Tot = the total quality factor,
- L-Tot = The total loss, and
- LAMDA = the guide wavelength of microstrip transmission line.

A maximum k can be calculated after giving due consideration to gap reproducibility. Assuming a 5 mil gap and a 50Ω system, k is calculated to be 0.178. This corresponds to a coupling coefficient $\beta_1$ of 9.8, which represents an upper limit at this frequency.

In order to obtain larger values for coupling coefficient $\beta_2$, it is appropriate to use the device shown in FIG. 3. Following the same procedure as above, the coupling coefficient is $$\beta_2 = \frac{\frac{Z_o}{Z_{cl} k_o^2} \cos^2\theta \, \frac{2Q_o}{\pi}}{1 + \left(\frac{1 - k_o^2}{k_o^2} \cot \phi\right)^2}$$

where:
- $Z_{cl} = 94\Omega$
- $K_o = 0.250$
- $\theta = \pi/4$
- $Z_o = 50\Omega$
- $\phi = (\pi/2)$ and where all other variables are as defined above.

Under the above-defined conditions, the upper limit for the coupling coefficient $\beta_2$ is calculated to be 1319. By changing $\phi$, it is possible to adjust $\beta_2$ to any desired value. It should be pointed out, that if $\phi$ is other than $\pi/2$, an adjustment in the length of the resonator is necessary.

While the present invention has been described in terms of a preferred embodiment, further modifications and improvements will occur to those skilled in the art. For example, although the above discussion centered around IMPATT diodes, other two-terminal as well as three-terminal active devices may be used in conjunction with the present invention. Furthermore, although the above discussion centered around a half-wave resonator, resonators having a length of a multiple of a half-wavelength or having an odd multiple of a quarter-wavelength (where one end of the resonator is open-circuited and the other end is short circuited), may also be used.

I desire it to be understood, therefore, that this invention is not limited to the particular form shown and that I intend in the appended claims to cover all such equivalent variations which come within the scope of the invention as described.

I claim:

1. A transmission line microwave oscillator having two degrees of freedom and including an active device for producing microwave oscillations, an input impedence as seen by the active device having a real portion, Rin, and the oscillator having an external quality factor, $Q_{EXT}$, the oscillator comprising:

resonant means electromagnetically coupled to the active device such that Rin is adjustable by changing the electromagnetic coupling between the active device and said resonant means; and an output transmission line electromagnetically coupled to said resonant means such that the $Q_{EXT}$ is adjustable by changing the electromagnetic coupling between said output transmission line and said resonant means.

2. The transmission line microwave oscillator of claim 1 wherein the active device is embedded in an input transmission line, wherein said resonant means comprises a portion of transmission line and wherein said input transmission line forms a coupled line mechanism with said portion of transmission line.

3. The transmission line microwave oscillator according to claim 2 further including a bias port coupled to said input transmission line.

4. The transmission line microwave oscillator according to claim 3 further comprising a bias filter coupled to said input transmission line between said bias port and the active device.

5. The transmission line microwave oscillator according to claim 4 wherein said bias filter comprises a plurality of open-circuit stubs coupled to said input transmission line.

6. The transmission line microwave oscillator according to claim 1 wherein said resonant means comprises a portion of transmission line and wherein said output transmission line forms a coupled line mechanism with said portion of transmission line.

7. The transmission line microwave oscillator according to claim 6 wherein said portion of transmission line includes an open-circuited stub, said stub forming said coupled line mechanism with said output transmission line.

8. The transmission line microwave oscillator according to claim 7 further including a bias port coupled to said input transmission line.

9. The transmission line microwave oscillator according to claim 8 further comprising a bias filter coupled to said input transmission line between said bias port and the active device.

10. The transmission line microwave oscillator according to claim 9 wherein said bias filter comprises a plurality of open-circuited stubs coupled to said input transmission line.

11. The transmission line microwave oscillator according to claim 7 wherein the active device is embedded in said portion of transmission line, wherein said portion of transmission line has an end proximal to the active device and an end distal to the active device and wherein said open-circuit stub is coupled to said portion of transmission line distal to the active device.

12. The transmission line microwave oscillator according to claim 11, further comprising a varactor coupled to said portion of transmission line between the active device and said open-circuited stub and further comprising a capacitance coupled to said portion of transmission line between the active device and said varactor.

13. The transmission line microwave oscillator according to claim 12 wherein said capacitance comprises a beam lead capacitor.

14. The transmission line microwave oscillator according to claim 13 including an input transmission line having a bias port coupled thereto, said input transmission line being electromagnetically coupled to said resonant means.

15. The transmission line microwave oscillator according to claim 14 further comprising a bias filter coupled to said input transmission line between said bias port and the active device.

16. The transmission line microwave oscillator according to claim 15 wherein said bias filter comprises a plurality of open-circuited stubs coupled to said input transmission line.

17. The transmission line microwave oscillator according to claim 1 wherein said resonant means comprises a portion of transmission line and wherein said output transmission line is directly attached to said portion of transmission line to form a tee junction.

* * * * *